United States Patent
Ribeiro et al.

(10) Patent No.: US 10,214,158 B2
(45) Date of Patent: Feb. 26, 2019

(54) DECORATIVE PART FOR MOTOR VEHICLES

(75) Inventors: Carlos Ribeiro, Ho Chi Minh (VN); Sascha Bauer, Meßkirch (DE)

(73) Assignee: OERLIKON SURFACE SOLUTIONS AG, PFÄFFIKON, Päffikon SZ (CH)

( * ) Notice: Subject to any disclaimer, the term of this patent is extended or adjusted under 35 U.S.C. 154(b) by 329 days.

(21) Appl. No.: 14/342,443

(22) PCT Filed: Aug. 29, 2012

(86) PCT No.: PCT/EP2012/003624
§ 371 (c)(1),
(2), (4) Date: May 9, 2014

(87) PCT Pub. No.: WO2013/034259
PCT Pub. Date: Mar. 14, 2013

(65) Prior Publication Data
US 2014/0242413 A1    Aug. 28, 2014

(30) Foreign Application Priority Data
Sep. 5, 2011 (DE) .......... 10 2011 112 288

(51) Int. Cl.
*B32B 5/14* (2006.01)
*B60R 13/04* (2006.01)
(Continued)

(52) U.S. Cl.
CPC .......... *B60R 13/04* (2013.01); *C23C 14/0015* (2013.01); *C23C 14/024* (2013.01); *C23C 14/025* (2013.01); *C23C 14/0641* (2013.01); *C23C 14/0664* (2013.01); *C23C 28/322* (2013.01); *C23C 28/34* (2013.01);
(Continued)

(58) Field of Classification Search
None
See application file for complete search history.

(56) References Cited

U.S. PATENT DOCUMENTS 4,415,421 A * 11/1983 Sasanuma ............. C23C 14/024
204/192.15
4,883,574 A * 11/1989 dos Santos Pereina Ribeiro ........
C23C 14/35
204/192.15
(Continued)

FOREIGN PATENT DOCUMENTS

DE   10-2005-053344 A1   5/2007
DE   102005053344   *   5/2007 ............. B60R 13/04
(Continued)

OTHER PUBLICATIONS

International Search Report for PCT/EP2012/003624 dated Dec. 4, 2012.

*Primary Examiner* — Seth Dumbris
(74) *Attorney, Agent, or Firm* — Pearne & Gordon LLP

(57) ABSTRACT

The present invention relates to a decorative part, comprising an electroplated layer array applied to a plastic substrate. On the electroplated layer array, a PVD layer array having an adhesive layer, a mixed layer and a color-providing cover layer is provided, wherein the mixed layer provides for durability, in particular corrosion protection, and the necessary hardness of the surface.

13 Claims, 1 Drawing Sheet

(51) Int. Cl.
 *C23C 14/00* (2006.01)
 *C23C 14/02* (2006.01)
 *C23C 14/06* (2006.01)
 *C23C 28/00* (2006.01)

(52) U.S. Cl.
 CPC ....... *C23C 28/36* (2013.01); *Y10T 428/12556* (2015.01); *Y10T 428/31678* (2015.04)

(56) References Cited

U.S. PATENT DOCUMENTS

| | | | | |
|---|---|---|---|---|
| 5,626,972 | A * | 5/1997 | Moysan, III | C23C 28/321 428/627 |
| 6,132,889 | A * | 10/2000 | Welty | C23C 28/00 428/623 |
| 6,391,457 | B1 * | 5/2002 | Welty et al. | 428/412 |
| 6,503,373 | B2 * | 1/2003 | Eerden | C23C 14/024 204/192.12 |
| 7,179,546 | B1 * | 2/2007 | Chen | 428/698 |
| 2002/0110700 | A1 * | 8/2002 | Hein et al. | 428/658 |
| 2008/0014420 | A1 | 1/2008 | Chan | |
| 2009/0181262 | A1 * | 7/2009 | Isaksson et al. | 428/626 |
| 2009/0202790 | A1 * | 8/2009 | Eerden et al. | 428/195.1 |

FOREIGN PATENT DOCUMENTS

| | | |
|---|---|---|
| WO | 03/053686 A1 | 7/2003 |
| WO | 2004/084690 A1 | 10/2004 |
| WO | 2005/118282 A2 | 12/2005 |

\* cited by examiner

DECORATIVE PART FOR MOTOR VEHICLES

The present invention relates to a decorative part for a motor vehicle. This decorative part comprises a substrate, an electroplated or galvanic layer array on the substrate and a PVD layer system on the electroplated layer array. PVD means physical vapor deposition.

Decorative parts for motor vehicles of the above-mentioned kind are known in the state of the art. Decorative elements that have a chrome-like appearance are often used. Meanwhile, other color effects are however also desirable. In order to achieve this, for example in DE 1020005053344 by Hoffmann, a coloring top coating is deposited by means of vapor deposition onto the electroplated layer array (called in that document carrier layer array) on the outer surface. As a result of this, a surface with hardness and resistance is created that has a particular colored design. The document describes that it is possible with vapor deposition to deposit nearly all known metals in very pure form and that by means of additional reactive gas such as for example hydrogen, oxygen or nitrogen it is possible to deposit carbides, oxides or nitrides.

The disadvantage in this respect, however, is that the top coating has to take on the functions of coloring as well as providing a hard and especially corrosion-resistant coating. Since the requirements in terms of resistance for example in the interior of a motor vehicle can possibly be completely different from those in the vehicle's outer areas, this in turn results in an undesirable limitation in the color design of the decorative elements.

In the frame of this invention, the term "decorative part" is to be interpreted broadly. This does not mean merely decorative strips or parts of the cooling grill but can include also parts with functional surfaces. These are mostly parts made of plastic substrates such as for example ABS and in particular PCABS that are coated with an electroplated layer array.

There is therefore a need for overcoming or at least reducing the above-mentioned disadvantages of the state of the art.

According to the invention, it is proposed to provide on the electroplated layer array a PVD layer system that comprises an adhesive layer lying directly on the electroplated layer array, a resistant and hard mixed layer applied onto the adhesive layer and a color-providing cover layer deposited onto the mixed layer. In doing so, the coloring top coating does not need to fulfill the requirements as to hardness and resistance of the mixed layer.

The adhesive layer applied by means of PVD comprises a material that bonds well onto the surface of the electroplated layer. This material is preferably very similar to the surface material of the electroplated layer array, with a particular preference for it even being essentially identical to it. If for example the layer finishing the electroplated layer array consists of chromium, a chromium layer applied by means of PVD can be used as adhesive layer. If in contrast thereto the layer finishing the electroplated layer array is a chromium-nickel layer or a layer with a high proportion of nickel, the use of zirconium as adhesive layer is advantageous if no PVD layer corresponding to nickel can be deposited. According to the invention, the adhesive layer has a thickness of 0.1 μm to 1 μm.

On the adhesive layer, a mixed layer of the type $(Me1_aMe2_b)_uX_v$ is applied by means of PVD according to the invention, wherein Me1 is a first metal and Me2 is a second metal different from the first metal, and wherein for the parameters a and b the following is true: a>0.05 and b>0.05 and a+b≤1, where a+b=1 would mean that Me1 and Me2 form 100% of the metallic elements in the mixed layer and wherein X is one or several elements from the group consisting of carbon, nitrogen and oxygen. The mixed layer can also contain further elements and in particular further metals. However, non-metallic adjunctions of elements that do not belong to the group X preferably make up less than 20 at % of the total.

The component X is present in the mixed layer at most in stoichiometric concentration, wherein at least in the vicinity of the adhesive layer a sub-stoichiometric concentration can be of advantage, since in this way the metallic character of the layer does not completely disappear. This is advantageous for the reason that this layer should be not only hard and resistant—especially towards corrosion—but should also serve as so-called offset layer for the reduction of layer tensions.

The mixed layer can be built from nano-layers in varying concentrations. This can be the case in particular if, in the context of the method used for generating the mixed layer, the components to be coated can be presented several times to two or more targets, for example on a rotating table. Such a nano-layer coating can advantageously result in further releasing the tension and thus in increasing the resistance of the PVD layer system. The indicated concentration is thus to be understood as an averaging of over at least 20 nm. The mixed layer has a thickness between 0.2 μm and 10 μm and preferably has a thickness of less than 1 ∞m and, even more preferably, a thickness between 250 nm and 350 nm.

The use of a mixed layer that contains chromium as Me1 and zirconium as Me2 has proven particularly suitable. Mixed layers that also contain nitrogen as well as carbon have also proven particularly suitable. A layer $(Cr_aZn_b)_u(C_kN_l)_v$ with a+b=1 and k+l=1 with a,b>0 and k,l>0 that comprises in a non-supra-stoichiometric manner non-metallic components has proven particularly suited and is to be deemed preferable for the inventive mixed layer.

The mixed layer can also have a progression of concentrations and in particular be a gradient layer. Particularly advantageous is a strongly metallic character in the vicinity of the adhesive layer and a gradual progression towards a layer with an overstoichiometric proportion of X.

On the mixed layer, a coloring cover layer is then deposited. The latter has a thickness between 0.1 μm and 2 μm. The downward limitation of the thickness must be complied with in order to ensure the desired color effect. The upward limitation of the thickness is of importance if the coloring top coating itself does not have the hardness and corrosion-resistance required for the decorative part. In the simplest case, chromium can be used as coloring top coating, namely whenever the decorative element is to have a chromed appearance. In this case, the transition from the mixed layer to the cover layer can be formed as a discontinuous transition. A gradual transition from the mixed layer to the cover layer can also be implemented. For example, as the distance from the center of the thickness increases, the proportion of chromium among the metallic elements in the mixed layer can increase up to 100% and the proportion of X decrease to 0%.

If the decorative element in contrast thereto is to be given the appearance of stainless steel, it is possible to apply as a top coating for example V2A steel by means of sputtering or to provide Zr—Cr—X, wherein the proportion of X can be chosen to be overstoichiometric.

Attention is drawn to the fact that the adhesive layer and/or the mixed layer and/or the cover layer can be formed each out of several distinct coating layers. In doing so, it is possible, for example by means of interference, to achieve different color effects, in particular in the case of the color-providing top coating.

The invention will now be explained in detail on the basis of an example and with the aid of the figures.

In order to explain the invention in more detail, the coating for an inventive decorative strip that is to have a so-called chrome look, will be described by way of example.

It is assumed that the one skilled in the art is familiar with the production of the substrate. It is also assumed that the one skilled in the art knows how to execute the electroplated layer array on the substrate. Should there be any questions in this respect, reference is made to the aforementioned DE102005053344.

Figure 1:
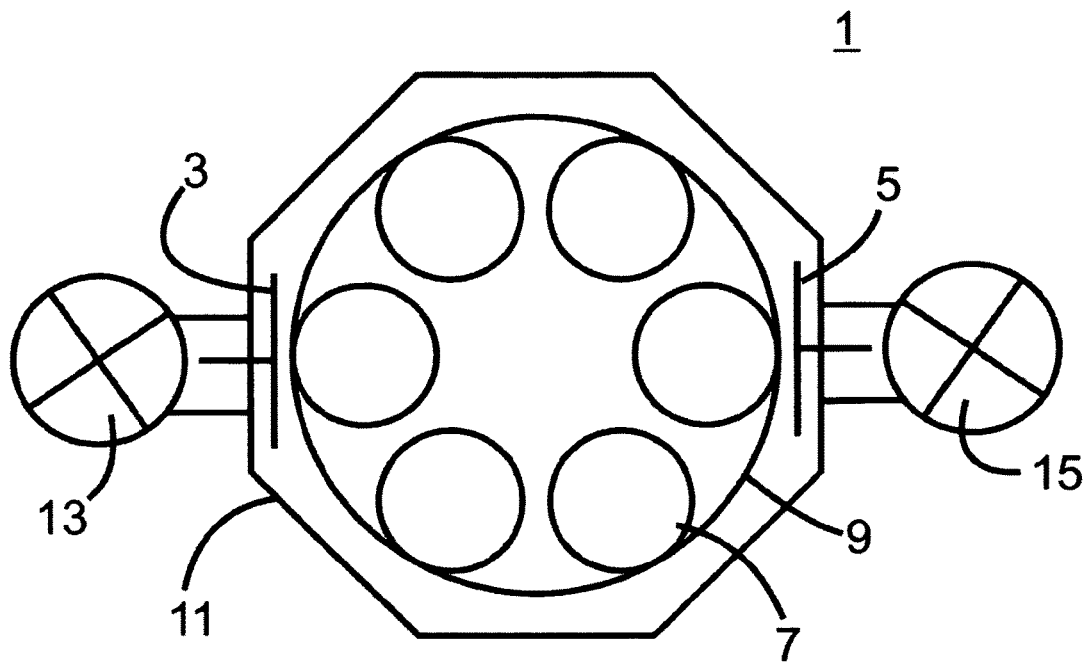
FIG. 1 shows diagrammatically a coating facility as it can be used for PVD coating.

A substrate coated in such a manner with an electroplated layer array is then placed in a coating facility 1 as shown in FIG. 1. The coating facility 1 comprises a first magnetron sputter target 3 and a second magnetron sputter target 5. The first magnetron sputter target 3 contains chromium as sputter material and is thus a chromium target. The second magnetron sputter target 5 contains zirconium as sputter material and is thus a zirconium target. A substrate to be coated is paced in a substrate holder 7 on a rotating table 9, wherein the substrate holder 7 can further be rotated around it sown axis. By means of the rotating table 9, the substrate can be presented alternatingly to the first and to the second magnetron sputter target 3, 5. Six substrate holders are shown in FIG. 1.

After the coating facility 1 has been loaded with the substrates, the coating chamber 11 is dosed and a vacuum is generated in the facility by means of vacuum pumps 13, 15. Subsequently, argon is made to flow into the coating chamber and a plasma is ignited. A negative bias is applied to the substrates. Ionized argon is first used to clean, possibly activate and then heat the surface of the electroplated layer array on the substrate to be coated. The substrate temperature should however be kept below 120° C., preferably below 100° C., in particular if—as in the present case—it is a plastic substrate.

After the cleaning step, power is first applied to the chromium target 3. Consequently, in the example, 24 A flow. In parallel thereto, the negative substrate bias is set to 65V. Pure chromium is sprayed during approx. 90 seconds and is deposited onto the substrates. The substrate has contributes to the chromium layer becoming thicker by means of on bombardment and thus also bonds better onto the substrate. The adhesive layer is thus deposited in this way.

Afterwards, essentially simultaneously, power on the chromium target 3 is increased to a current of 32 A, power on the zirconium target 5 is applied so that 24 A flow and nitrogen with 100 sccm and, slightly offset in terms of time, 35 sccm of acetylene ($C_2H_2$) is made to flow into the coating chamber 11. The gas influx is in this respect limited to values that ensure that the growing layer does not contain the components of this gas in overstoichiometric manner. The negative bias voltage is lowered to 45V, which results in fewer layer tendons being built into the layer thus formed. In this manner, the inventive mixed layer is deposited, which in this case is a Cr—Zr—C—N layer.

Subsequently, the power on the zirconium target 5 is switched off and the influx of nitrogen and acetylene is prevented, so that only argon flows into the chamber and power is applied to the chromium target, which results in a current flow of 38 A. In this manner, a coloring cover layer is generated for 120 seconds that gives the decorative part the desired chrome look. The presently indicated parameters are tailored for the corresponding coating facility. Although they will vary from one facility to the next, the one skilled in the art knows how the parameters are to be adapted to the coating facility available to him in order to achieve the desired result.

Figure 2:
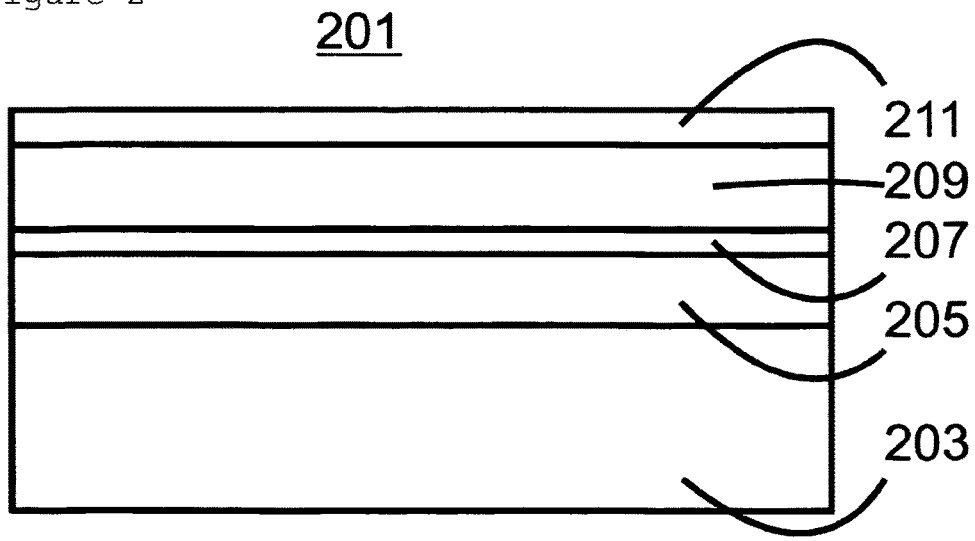
FIG. 2 shows the diagrammatic layer structure of one part of an inventive decorative element according to one embodiment of the present invention.

FIG. 2 represents diagrammatically the layer structure of an extract 201 of a decorative part corresponding to the embodiment of the present invention. An electroplated layer array 205 is applied onto a substrate 203. On this electroplated layer array, an adhesive layer 207, a nixed layer 209 and a coloring cover layer 211 are applied in this sequence.

If instead of a chrome look, brass or yellow tones are to be achieved, ZrN is suitable as a top coating. If a green or brown surface is to be achieved, this can be done with Zr—C—N as top coating, each time with adapted carbon and nitrogen proportions. If the surface is to be given the appearance of stainless steel, V2A can be sprayed as cover layer. Grey tones can be attained by means of Cr—Zr—C—M with C and/or N being present in overstoichiometric manner in the top coating.

What is claimed is:

1. Decorative part for a motor vehicle, comprising:
   a substrate,
   an electroplated layer array on the substrate wherein the electroplated layer array comprises multiple metal layers, and
   a coloring cover layer applied to the outer surface of the electroplated layer array by means of physical vapor deposition,
   wherein the coloring cover layer is part of a PVD layer system that comprises, between the substrate and the coloring cover layer, an adhesive layer directly on the electroplated layer array and that comprises, between the adhesive layer and the coloring cover layer being the outermost layer, a mixed layer directly on the adhesive layer,
   wherein the mixed layer comprises at least a first metal Me1 and a second metal Me2 and element X,
   wherein X is at least one element from the group consisting of carbon and nitrogen,
   wherein X has, at least in a portion of the mixed layer, a sub-stoichiometric concentration, and
   wherein the concentration of element X varies within the mixed layer from a sub-stoichiometric concentration at the interface of the mixed layer and the adhesive layer to a layer with an over-stoichiometric concentration.

2. Decorative part according to claim 1, characterized in that the mixed layer is formed according to the formula $(Me1_a Me2_b)_u X_v$, wherein a+b≤1.

3. Decorative part according to claim 2, characterized in that a+b=1 and thus Me1 and Me2 are the only metallic elements in the mixed layer.

4. Decorative part according to claim 1, characterized in that Me1 is chromium and Me2 is zirconium.

5. Decorative part according to claim 1, characterized in that X comprises both nitrogen as well as carbon.

6. Decorative part according to claim 1, characterized in that the adhesive layer, the mixed layer and the coloring cover layer comprises each chromium or each zirconium or each both elements.

7. Decorative part according to claim 1, characterized in that the coloring cover layer comprises nitrogen and carbon.

8. Decorative part according to claim 1, wherein the substrate is a plastic substrate.

9. Decorative part according to claim 5, wherein X consists of nitrogen and carbon.

10. Decorative part according to claim 7, wherein the coloring cover layer comprises nitrogen and carbon in an overstoichiometric manner.

11. Decorative part according to claim 1, wherein the adhesive layer comprises a metallic layer.

12. Decorative part according to claim 11, wherein the metallic layer includes one of chromium and zirconium.

13. Decorative part according to claim 1, wherein the portion is directly in contact with the adhesive layer.

* * * * *

UNITED STATES PATENT AND TRADEMARK OFFICE
CERTIFICATE OF CORRECTION

PATENT NO. : 10,214,158 B2
APPLICATION NO. : 14/342443
DATED : February 26, 2019
INVENTOR(S) : Carlos Ribeiro et al.

Page 1 of 1

It is certified that error appears in the above-identified patent and that said Letters Patent is hereby corrected as shown below:

In the Specification

Column 2, Line 29, "1 ∞m" should be -- 1µm --.

Column 2, Line 34, "$(Cr_a Zn_b)_u$" should be -- $(Cr_a Zr_b)_u$ --.

Signed and Sealed this
Twenty-eighth Day of May, 2019

Andrei Iancu
*Director of the United States Patent and Trademark Office*